(12) United States Patent
Jun

(10) Patent No.: US 9,006,722 B2
(45) Date of Patent: Apr. 14, 2015

(54) LIGHT EMITTING DISPLAY

(71) Applicant: Samsung Display Co., Ltd., Yongin, Gyeonggi-Do (KR)

(72) Inventor: Woo Sik Jun, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/018,527

(22) Filed: Sep. 5, 2013

(65) Prior Publication Data

US 2014/0346447 A1 Nov. 27, 2014

(30) Foreign Application Priority Data

May 21, 2013 (KR) .................. 10-2013-0057199

(51) Int. Cl.
*H01L 51/52* (2006.01)

(52) U.S. Cl.
CPC .................... *H01L 51/5271* (2013.01)

(58) Field of Classification Search
CPC ............ H01L 27/3242; H01L 27/3246; H01L 27/3248; H01L 51/56; H01L 51/5221; H01L 51/5271
USPC ................................ 257/40, 59, 72
See application file for complete search history.

(56) References Cited

U.S. PATENT DOCUMENTS

| 8,106,402 | B2 * | 1/2012 | Yeo et al. ................... 257/72 |
| 2010/0193790 | A1 * | 8/2010 | Yeo et al. ................... 257/59 |
| 2011/0050604 | A1 * | 3/2011 | Kwon et al. ................ 345/173 |
| 2013/0256638 | A1 * | 10/2013 | Uesugi et al. ................ 257/40 |

FOREIGN PATENT DOCUMENTS

| KR | 1020040102653 A | 12/2004 |
| KR | 1020060091648 A | 8/2006 |
| KR | 1020070003441 A | 1/2007 |

* cited by examiner

*Primary Examiner* — Nikolay Yushin
(74) *Attorney, Agent, or Firm* — Cantor Colburn LLP

(57) ABSTRACT

A light emitting device includes a pixel defining layer including a plurality of pixel defining layer elements, on a substrate; a first electrode in a space defined by the substrate and the pixel defining layer; a light emitting layer in a space defined by the first electrode and the pixel defining layer; and a second electrode on the light emitting layer and the pixel defining layer. The second electrode includes a plurality of layers, and an insulating layer between the plurality of layers, overlapping the light emitting layer, and exposing a layer among the plurality of layers in an area corresponding to the pixel defining layer.

14 Claims, 15 Drawing Sheets

LIGHT EMITTING DISPLAY

This application claims priority to Korean Patent Application No. 10-2013-0057199 filed on May 21, 2013, and all the benefits accruing there from under 35 U.S.C. 119, the contents of which in its entirety are herein incorporated by reference.

BACKGROUND

The invention relates to a light emitting display and an organic electroluminescence device, and a method for manufacturing the same.

The field of display devices has been rapidly developed, and various flat panel display devices having excellent performance characteristics such as a having a slim profile, being lightweight and having a low power consumption have been developed in response thereto to replace an existing cathode ray tube ("CRT") display device.

Specific examples of the flat panel display device may include a liquid crystal display device ("LCD"), a plasma display panel device ("PDP"), a field emission display device ("FED"), an organic electroluminescence device, and the like.

Among them, the organic electroluminescence device has come into the spotlight because the organic electroluminescence device does not use a separate light source, has a compact structure and displays a clear color.

SUMMARY

In a light emitting device, when a foreign material (e.g., a particle) exists on a first electrode, an electrical short occurs between the first electrode and a second electrode around the foreign material to form an undesirable dark spot in a display device including the light emitting device. The occurrence of the short can be reduced when a cross-sectional thickness of the second electrode is reduced, but electrical resistance thereof increases. As a result, an optical characteristic of a product such as a display device including the light emitting device deteriorates and driving voltage increases, to undesirably increase power consumption of the product.

Therefore, one or more exemplary embodiment of the invention provides a light emitting device that reduces electrical resistance of the second electrode while reducing or effectively preventing an electrical short between the first electrode and the second electrode.

Further, one or more exemplary embodiment of the invention provides a method for manufacturing the light emitting device.

The invention are not limited to the aforementioned technical features and advantages, and unmentioned other technical objects will be apparently appreciated by those skilled in the art based on a description below.

An exemplary embodiment of the invention provides a light emitting device, including a pixel defining layer including a plurality of pixel defining layer elements, on a substrate; a first electrode in a space defined by the substrate and the pixel defining layer; a light emitting layer in a space defined by the first electrode and the pixel defining layer; and a second electrode on the light emitting layer and the pixel defining layer. The second electrode includes a plurality of layers, and an insulating layer between the plurality of layers, overlapping the light emitting layer, and exposing a layer among the plurality of layers in an area corresponding to the pixel defining layer.

An exemplary embodiment of the invention also provides an organic electroluminescence device, including a pixel defining layer including a plurality of pixel defining layer elements on a transparent substrate, and having an electrical insulating property; an anode on the transparent substrate and in a space defined by the transparent substrate and the pixel defining layer; an organic light emitting layer in a space defined by the anode and the pixel defining layer; and a cathode on the organic light emitting layer. The cathode includes a first metallic layer adjacent to the organic light emitting layer, and a second metallic layer having a cross-sectional thickness larger than that of the first metallic layer, and spaced apart from the organic light emitting layer. The first metallic layer is between the second metallic layer and the organic light emitting layer.

An exemplary embodiment of the invention provides a method for manufacturing a light emitting device, including providing a substrate, and a pixel defining layer including a plurality of pixel defining layer elements, an anode and a light emitting layer, on the substrate; providing a first layer on the light emitting layer and the pixel defining layer; providing an insulating layer in an area corresponding to the light emitting layer, by using a mask patterned on the first layer; and providing a second layer on the insulating layer and the first layer.

An exemplary embodiment of the invention provides a method for manufacturing a light emitting device, including providing a substrate, and a pixel defining layer including a plurality of pixel defining layer elements, an anode and a light emitting layer, on the substrate; providing a first layer on the light emitting layer and the pixel defining layer; providing an insulating layer on the first layer; exposing the first layer by removing a portion of the insulating layer in an area corresponding to the pixel defining layer; and providing a second layer on the insulating layer and the exposed portion of the first layer.

According to one or more exemplary embodiment of the invention, at least the following effect is acquired.

Occurrence of a dark spot can be reduced or effectively prevented even though a foreign material is introduced during a manufacturing process, and electrical resistance is not increased to reduce or effectively prevent degradation in an optical characteristic, an increase in driving voltage and an increase in power consumption.

Effects according to the invention are not limited by contents exemplified as above and more various effects are included in the specification.

BRIEF DESCRIPTION OF THE DRAWINGS

The above and other features and advantages of the invention will become more apparent by describing in detail embodiments thereof with reference to the attached drawings in which.

DETAILED DESCRIPTION

Figure 1:
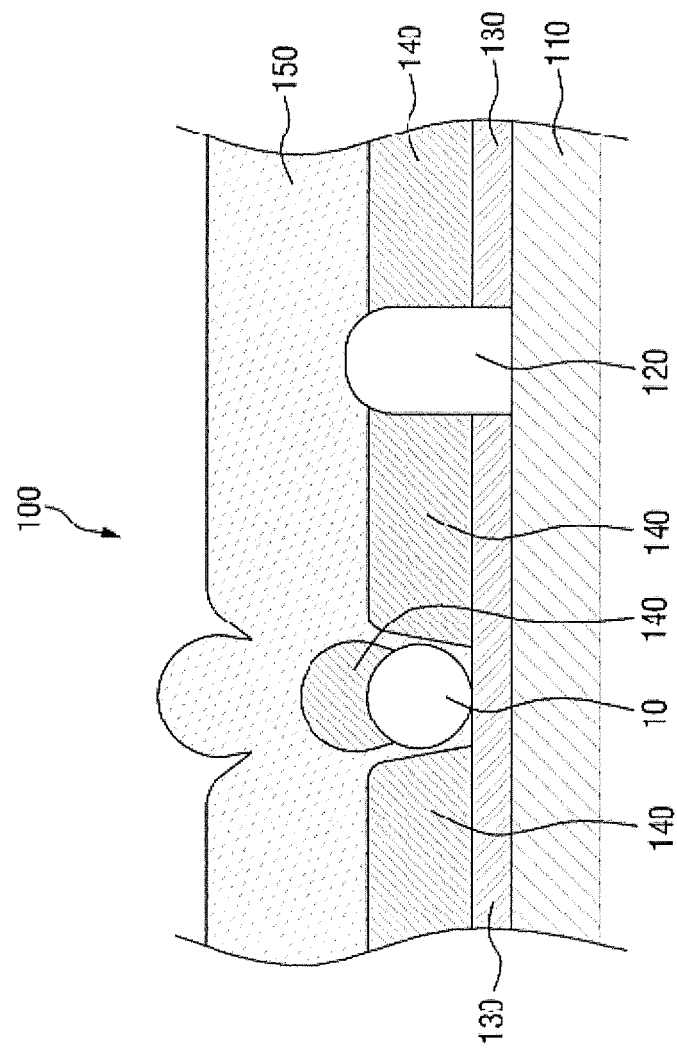
FIG. 1 is a schematic cross-sectional view of a light emitting device according to one example of the related art.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," or "connected to" another element or layer, it can be directly on or connected to the other element or layer or intervening elements or layers may be present. In contrast, when an element is referred to as being "directly on," or "directly connected to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, the invention will be described in detail with reference to the accompanying drawings.

FIG. 1 is a cross-sectional view illustrating a configuration of a conventional light emitting device. Referring to FIG. 1, a light emitting device 100 includes a substrate 110, a pixel defining layer ("PDL") element 120 disposed on the substrate 110, a first electrode 130 disposed in a space defined by the substrate 110 and the PDL 120, a light emitting layer 140 disposed on the first electrode 130 in a space defined by the first electrode 130 and the PDL 120, and a second electrode 150 disposed on the light emitting layer 140 and the PDL 120. The light emitting device 100 may include a plurality of PDL elements 120 defining a plurality of pixels and forming a PDL layer.

A foreign material 10 may be introduced while manufacturing the light emitting device 100. When the foreign material 10 is positioned on the first electrode 130, a step coverage is insufficient when the light emitting layer 140 is formed (e.g., provided), and as a result, the light emitting layer 140 is not formed at an area occupied by the foreign material 10 at an upper part of the first electrode 130. In this state, where the second electrode 150 is formed and a step coverage of a forming material of the second electrode 150 is excellent, the second electrode 150 is formed at an area where the light emitting layer 140 is not formed due to being covered by the foreign material 10 in the upper part of the first electrode 130.

Consequently, the first electrode 130 and the second electrode 150 are electrically shorted from each other to blacken a pixel including the foreign material 10.

In order to reduce or effectively prevent the short, a cross-sectional thickness of the second electrode 150 may be reduced. Hereinafter, this will be described with reference to FIG. 2.

Figure 2:
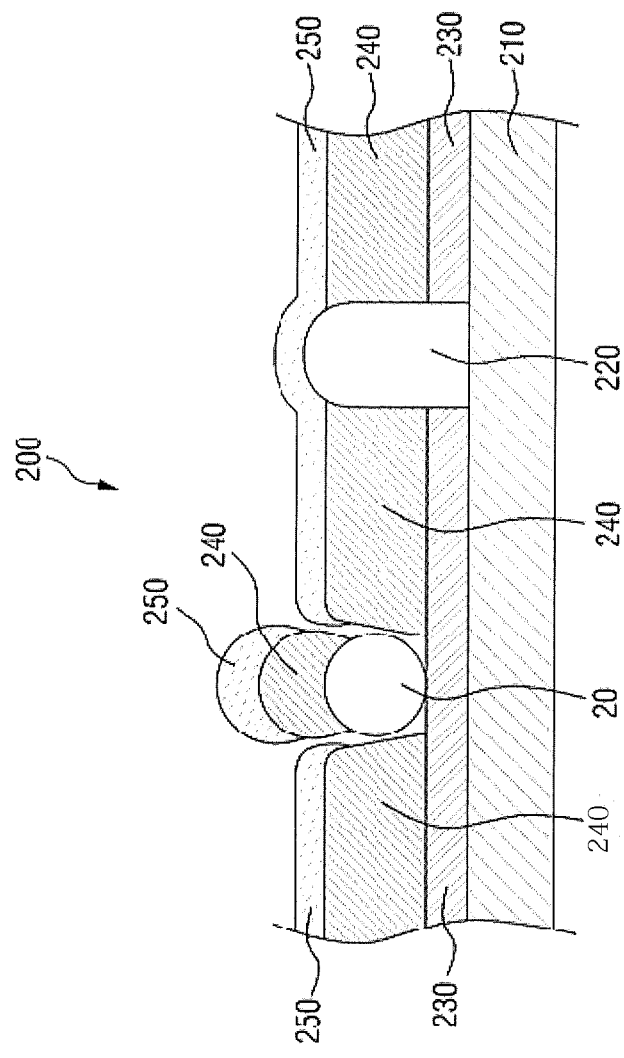
FIG. 2 is a schematic cross-sectional view of a light emitting device according to another example of the related art.

Referring to FIG. 2, a light emitting device 200 includes a substrate 210, a PDL 220 disposed on the substrate 210, a first electrode 230 disposed in a space defined by the substrate 210 and the PDL 220, a light emitting layer 240 disposed on the first electrode 230 in a space defined by the first electrode 230 and the PDL 220, and a second electrode 250 disposed on the light emitting layer 240 and the PDL 220.

A basic configuration of the light emitting device 200 is the same as the configuration of the light emitting device 100 of FIG. 1. However, the light emitting device 200 is different from the light emitting device 100 in that the cross-sectional thickness of the second electrode 250 is smaller. In the light emitting device 200, when the cross-sectional thickness of the second electrode 250 is relatively small, a step coverage of the second electrode 250 is not excellent to cover the cross-sectional thickness of the light emitting layer 240, and as a result, the first electrode 230 and the second electrode 250 are not electrically shorted from each other.

However, when the cross-sectional thickness of the second electrode 250 is small as described above, electrical resistance of the second electrode 250 increases. As a result, an optical characteristic of a product including the light emitting device 200 deteriorates and driving voltage increases, such that power consumption undesirably increases and long range uniformity ("LRU") of luminance decreases. Further, where the second electrode 250 includes a reflective material, when the cross-sectional thickness thereof is small, transmittance undesirably increases.

Hereinafter, an organic electroluminescence device according to the invention will be described with reference to FIG. 3.

Figure 3:
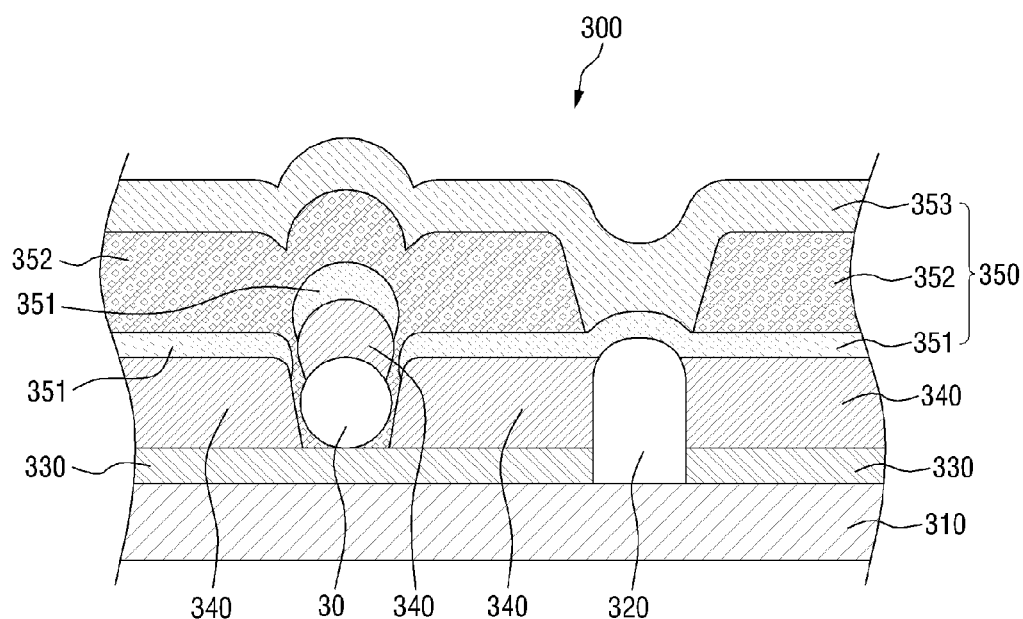
FIG. 3 is a schematic cross-sectional view of an exemplary embodiment of a light emitting device according to the invention.

FIG. 3 is a schematic cross-sectional view of an exemplary embodiment of a light emitting device according to the invention. As illustrated in FIG. 3, a light emitting device 300 includes a substrate 310, a PDL 320 disposed on the substrate 310, a first electrode 330 disposed on an upper part of the substrate 310 in a space defined by the substrate 310 and the PDL 320, a light emitting layer 340 disposed on the first electrode 330 in a space defined by the first electrode 330 and the PDL 320, and a second electrode 350 disposed on the light emitting layer 340 and the PDL 320. The second electrode 350 includes a first layer 351, an insulating layer 352 and a second layer 353.

The second electrode 350 includes the first layer 351 and the second layer 353, with the insulating layer 352 interposed therebetween in an area corresponding to the light emitting layer 340. In the above configuration, the first layer 351 has a relatively small cross-sectional thickness and the second layer 353 has a relatively large cross-sectional thickness. When the thickness of the first layer 351 adjacent to the light emitting layer 340 is small, an electrical short caused by a step coverage when a foreign material 30 exists on the first electrode 330, is reduced or effectively prevented.

An area of the light emitting device 300 corresponding to the PDL 320 does not include the insulating layer 352, and the first layer 351 and the second layer 353 are in contact with each other. Since the electrical short does not occur even though the foreign material 30 exists on the first electrode 330, the insulating layer 352 need not be included. Therefore, the first layer 351 and the second layer 353 physically and/or electrically contact each other. As a result, the overall thickness of the second electrode 350 is increased and thus, the resistance of the second electrode 350 does not increase.

In one exemplary embodiment, one of the first electrode 330 and the second electrode 350 may include a metallic film which is a reflection film. The other one of the first electrode 330 and the second electrode 350 may include a material such as indium tin oxide ("ITO"), indium zinc oxide ("IZO"), tin oxide ($SnO_2$), zinc oxide (ZnO), or a combination thereof which is transparent and high in conductivity.

The light emitting device 300 of the invention may have a bottom emission structure in which the first electrode 330 is an anode, the second electrode 350 is a cathode, and light emitted from the light emitting layer 340 is emitted toward the anode. Here, the first electrode 330 includes a transparent electrode and the second electrode 350 includes a metallic material in order to serve as the reflection film.

The thickness of the first layer 351 is configured to be smaller than that of the second layer 353. In one exemplary embodiment, the thickness of the first layer 351 may have a thickness in the range of about 700 angstroms (Å) to about 900 Å. When the first layer 351 includes the metallic material and has a thickness less than 700 Å, light transmission may undesirably partially occur. Further, when the first layer 351 has a thickness more than 900 Å and a step coverage occurs in the upper area of the first electrode 330 owing to the absence of the light emitting layer 340 due to covering by an existing foreign material 30, the first layer 351 contacts the first electrode 330 and undesirably causes an electrical short.

The second layer 353 is thicker than the first layer 351 in order to reduce total electrical resistance of the second electrode 350. In one exemplary embodiment, the second layer 353 may have a thickness in the range of about 2100 Å to 2300 Å. When the thickness of the second layer 353 is less than 2100 Å, the driving voltage undesirably increases, and when the thickness of the second layer 353 is more than 2300 Å, a decrease effect of the driving voltage is insignificant but the thickness and size of the display device itself undesirably increases.

The metallic material used in the first layer 351 and the second layer 353 is not particularly limited, but may include, for example, aluminum (Al), silver (Ag), copper (Cu), and the like. The first layer 351 and the second layer 353 may include the same metallic material or different metallic materials.

In one exemplary embodiment, the first layer 351 may include aluminum (Al). Resistivity of the first layer 351 adjacent to the light emitting layer 340 may be relatively the same as or higher than that of the second layer 353. Here, the second layer 353 may include aluminum (Al), silver (Ag), copper (Cu), and the like.

The insulating layer 352 is interposed between the first layer 351 and the second layer 353 in an area corresponding to the light emitting layer 340, to reduce or effectively prevent an electrical short between the first electrode 330 and the second electrode 350.

As the insulating layer 352, any of a number of the materials that have an electrical insulation property may be used, regardless of being either an organic material or an inorganic material. In one exemplary embodiment, the insulating layer 352 may include an organic material, and the organic material may include LiQ, $Alq_3$, and the like, which are comparatively inexpensive, but not being limited thereto.

In an exemplary embodiment of a method of manufacturing the organic electroluminescence device, the insulating layer 352 may be formed (e.g., provided) by using a pattern mask, or an area corresponding to the PDL 320 may be removed after the insulating layer 352 is entirely formed by using an open mask, such that the insulating layer 352 is disposed except for the area corresponding to the PDL 320.

The substrate 310 may include a glass substrate or a transparent plastic substrate which is excellent in transparency, surface smoothness, ease of handling and waterproof property, but the substrate 310 is not limited thereto.

The PDL 320 as a pixel defining layer includes a material having an electrical insulation property. The area of the light emitting device 300 corresponding to the PDL 320 is also referred to as a non-emission area.

The light emitting layer 340 may be, for example, an organic light emitting layer. Although not illustrated, the organic light emitting layer may include a hole injection layer, a hole transporting layer, an inner light emission layer, an electron transporting layer and/or an electron injection layer. The respective layers of the light emitting layer 340 may be separately configured, or two or more layers may be configured as a monolayer. Further, each layer may include a plurality of sub-layers.

The organic light emitting layer may be a structure adopting a high-molecule inner emission layer or a structure adopting a low-molecular inner emission layer.

In the structure adopting the high-molecule inner emission layer, an exemplary embodiment of the structure of the organic light emitting layer will be described as an example, but the invention is not limited thereto.

The thickness of the hole injection layer may be in the range of about 300 Å to about 1500 Å. When the thickness of the hole injection layer is less than 300 Å, a hole injection characteristic deteriorates. Even when the thickness of the hole injection layer is more than 1500 Å, a hole injection capability is not substantially changed. As a result, it may not be necessary for the hole injection layer to be thick to reduce or effectively prevent undesirably increasing the driving voltage due to the hole injection material.

The thickness of the hole transporting layer may be in the range of about 50 Å to about 1500 Å. When the thickness of the hole transporting layer is less than 50 Å, a hole transporting characteristic deteriorates, and when the thickness of the hole transporting layer is more than 1500 Å, the driving voltage undesirably increases.

The inner emission layer may include a phosphorescence and/or fluorescence material, but the t invention is not limited thereto.

The electron injection layer may be selectively disposed on the inner emission layer. A material of the electron injection layer is not particularly limited, and examples thereof may include ionomer (for example, sodium, sulfonated polystyrene), metal halide (for example, Lif, CsF, and $BaF_2$), metal oxide (for example, $Al_2O_3$), and the like.

In the structure adopting the low-molecule inner emission layer, the structure of the organic light emitting layer will be described as an example, but the invention is not limited thereto.

The thickness of the hole injection layer may be in the range of about 50 Å to 1500 Å. When the thickness of the hole injection layer is less than 50 Å, a hole injection characteristic deteriorates, and when the thickness of the hole injection layer is more than 1500 Å, the driving voltage undesirably increases.

The thickness of the hole transporting layer may also be in the range of about 50 Å to 1500 Å. When the thickness of the hole transporting layer is less than 50 Å, a hole transporting characteristic deteriorates. Even when the thickness of the hole transporting layer is more than 1500 Å, the hole injection capability is not substantially changed. As a result, it may not be necessary for the hole transporting layer to be thick to reduce or effectively prevent undesirably increasing the driving voltage due to the hole injection material.

In the structure adopting the low-molecule inner emission layer, a red emission material, a green emission material and a blue emission material are patterned in R, G and B areas among pixel areas of the organic electroluminescent device, on the hole injection layer and the hole transporting layer, to provide the inner emission layer ("EML") which corresponds to the pixel area. As the emission material, a combination of two or more host materials may be used. Here, a separate insulating film may be further disposed on the first electrode 330.

The thickness of the EML is desirably in the range of about 100 Å to 2000 Å, and for example, may be in the range of about 300 Å to about 400 Å. When the thickness of the EML is less than 100 Å, efficiency and a life-span of the device including the EML deteriorate, and when the thickness of the EML is more than 800 Å, the driving voltage undesirably increases.

The electron transporting layer ("ETL") is disposed on the top of the EML. As a material of the ETL, any of a number of materials may be used, and for example, $Alq_3$ may be used. The thickness of the ETL may be in the range of about 50 Å to about 600 Å. When the thickness of the ETL is less than 50 Å, a life-span characteristic deteriorates, and when the thickness of the ETL is more than 600 Å, the driving voltage undesirably increases.

The electron injection layer ("EIL") may be selectively laminated on the ETL. A material of the ETL, is not particularly limited and examples thereof may include LiF, NaCl, CsF, $Li_2O$, BaO, Liq and the like. The thickness of the ETL, may be in the range of about 1 Å to about 100 Å. When the thickness of the EIL is less than 1 Å, the EIL does not serve as an effective EIL, and thus the driving voltage is high. When the thickness of the ETL, is more than 100 Å, the EIL serves as the insulating layer, and thus the driving voltage is high.

The hole injection layer may include an organic film, and the organic film may be laminated by any of a number of methods, for example, a vacuum thermal deposition or spin coating method.

The hole transporting layer may be selectively laminated on the hole injection layer by the vacuum thermal deposition or spin coating method, the EML is laminated on the hole injection layer or the hole transporting layer (where the hole transporting layer is omitted), and a method of providing the EML is not particularly limited, but may include vacuum deposition, inkjet printing, laser transfer, photolithography, and the like.

The ETL and the EIL may be selectively formed on the EML by the vacuum deposition method or the spin coating method.

In one exemplary embodiment, the light emitting layer 340 may emit a specific color such as red, green or blue. Adjacent pixels of the organic electroluminescent device may emit different colors when the light emitting layer 340 emits a specific color such as red, green or blue. The adjacent pixels form a plurality of groups and each group may show white light. Alternatively, the light emitting layer 340 may be a white light emitting layer that emits the white light by itself. When the white light is emitted by the light emitting layer 340, a color filter (not shown) is additionally installed on an emission surface of the organic electroluminescent device to implement various colors.

Figure 4:
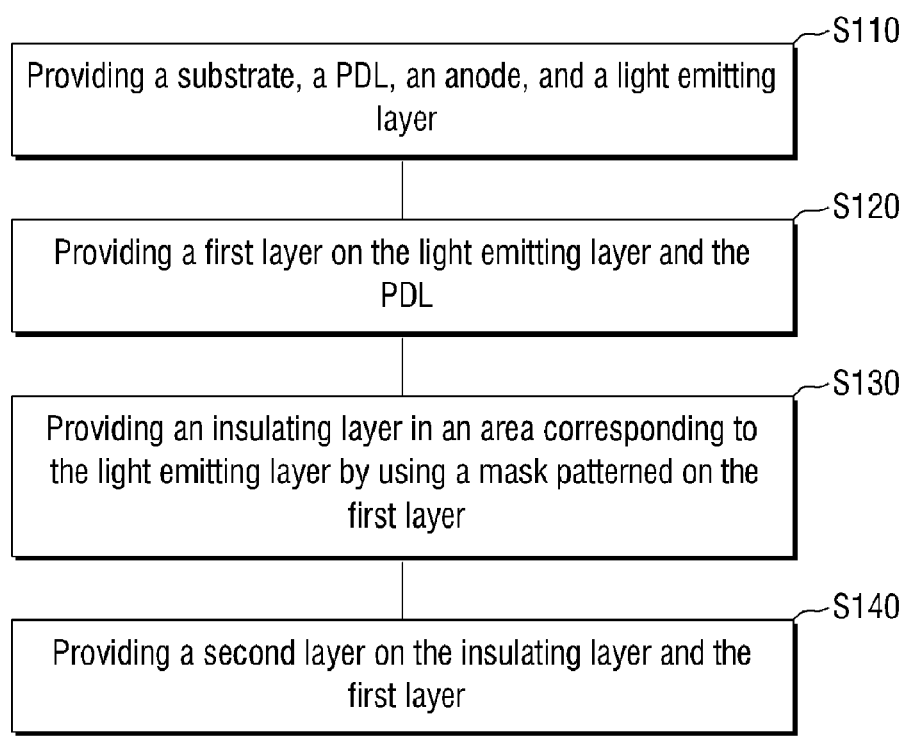
FIG. 4 is a process flowchart of an exemplary embodiment of a method for manufacturing a light emitting device according to the invention.

FIG. 4 is a flowchart of an exemplary embodiment of a method for manufacturing a light emitting device according to the invention. FIGS. 5A to 5D are schematic cross-sectional views illustrating a configuration of the light emitting device in the method for manufacturing of FIG. 4.

An exemplary embodiment of a method for manufacturing a light emitting device according to the invention includes forming (e.g., providing) a substrate 310, a PDL 320, an anode 330 and a light emitting layer 340 (S110), forming a first layer 351 on the light emitting layer 340 and the PDL 320 (S120), forming an insulating layer 352 in an area corresponding to the light emitting layer 340 by using a mask patterned on the first layer 351 (S130), and forming a second layer 353 on the insulating layer 352 and the first layer 351 (S140).

Figure 5A:
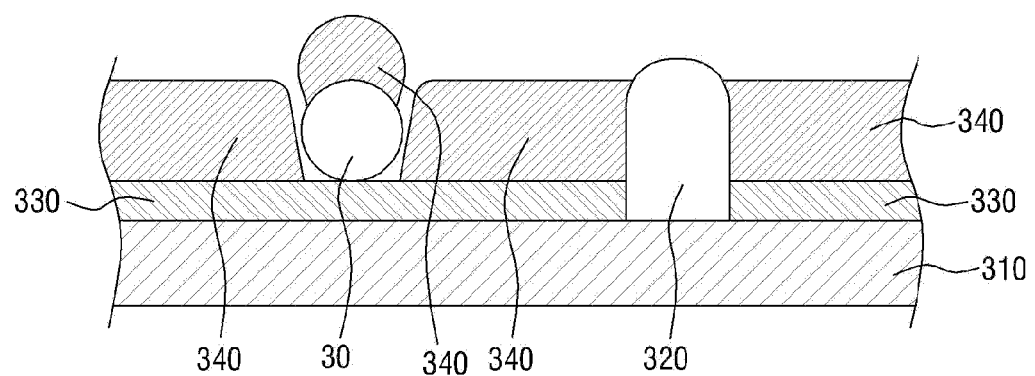
FIGS. 5A to 5D are schematic cross-sectional views of the light emitting device in the method for manufacturing of FIG. 4.

Referring to FIG. 5A, the anode 330 is formed on the substrate 310 in a space defined by the PDL 320 and the substrate 310, and the light emitting layer 340 is formed on the anode 330 in a space defined by the anode 330 and the PDL 320.

The substrate 310 may include a glass substrate or a transparent plastic substrate which is excellent in transparency, surface smoothness, ease of handling and waterproof property, but the substrate 310 is not limited thereto.

The PDL 320 includes an electrically insulating material and serves to distinguish each pixel of a display device which includes the light emitting device.

The anode 330 may include any of a number of materials which are transparent and excellent in conductivity, and may include, for example, ITO, IZO, $SnO_2$, ZnO or a combination thereof.

The light emitting layer 340 may include a hole injection layer, a hole transporting layer, an EML, an ETL and/or an EIL sequentially formed. The respective layers may be separately configured or two or more layers may form a monolayer, and some layers may be selectively omitted. Further, a respective layer may include a plurality of sub-layers.

The hole injection layer may include an organic film, and the organic film may be laminated by any of a number of methods, for example, a vacuum thermal deposition or spin coating method.

The hole transporting layer may be selectively laminated on the hole injection layer by the vacuum thermal deposition or spin coating method, the EML is laminated on the hole injection layer or the hole transporting layer (where the hole transporting layer is omitted), and a forming method of the EML is not particularly limited, but may include vacuum deposition, inkjet printing, laser transfer, photolithography, and the like.

The ETL and the EIL may be selectively formed on the EML by the vacuum deposition method or the spin coating method.

Figure 5B:
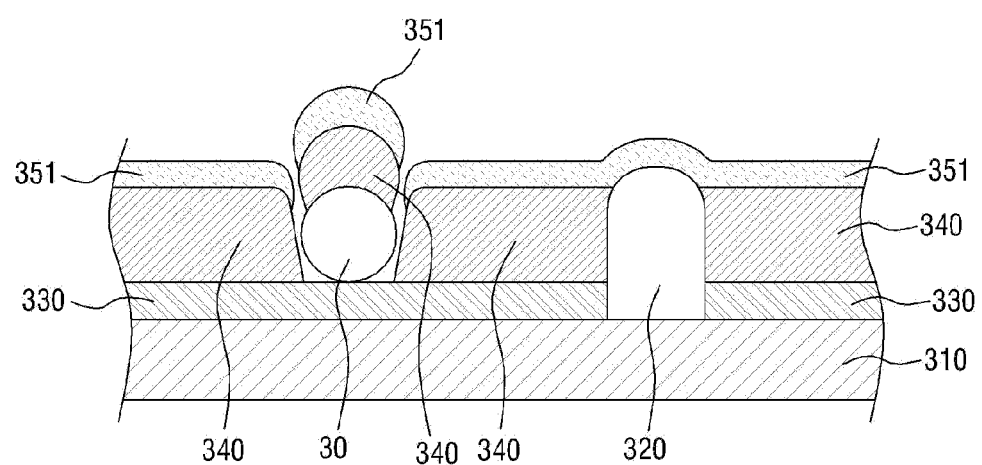

Referring to FIG. 5B, a first layer 351 may be formed on the light emitting layer 340 and the PDL 320. The first layer 351 may include a metallic material having light reflectivity, for example, aluminum (Al). The first layer 351 may be formed by a deposition method, and for example, methods such as e-beam deposition, thermal evaporation, and sputtering may be used. The first layer 351 may be formed by using an open mask. The first layer 351 may be formed to have a thickness in the range of about 700 Å to about 900 Å.

Figure 5C:
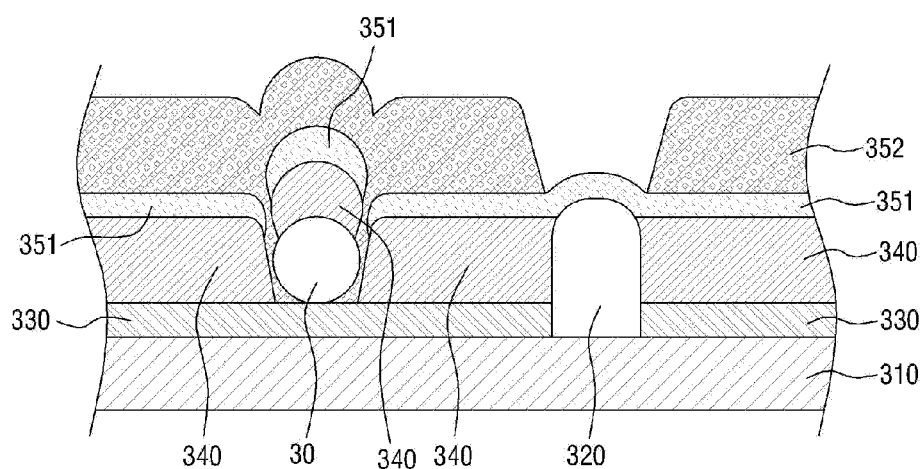

Referring to FIG. 5C, the insulating layer 352 may be formed in only in an area corresponding to the light emitting layer 340 by using a mask (not shown) patterned on the first layer 351. An area corresponding to the PDL 320 is shielded by the mask, and the insulating layer 352 may be formed by using a mask of which the area corresponding to the light emitting layer 340 is opened (e.g., not shielded). The material of the insulating layer 352 may include LiQ, $Alq_3$, and the like as organic materials that are comparatively inexpensive, but the material is not limited thereto.

Figure 5D:
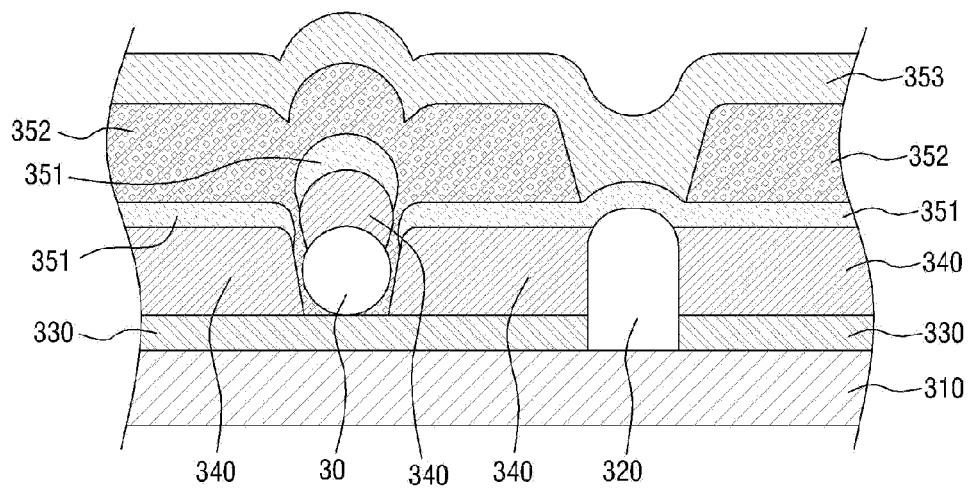

Referring to FIG. 5D, a second layer 353 is formed on the insulating layer 352 and the first layer 351. The second layer 353 may be formed similarly to the first layer 351, and the thickness of the second layer 353 may be in the range of about 2100 Å to about 2300 Å.

Figure 6:
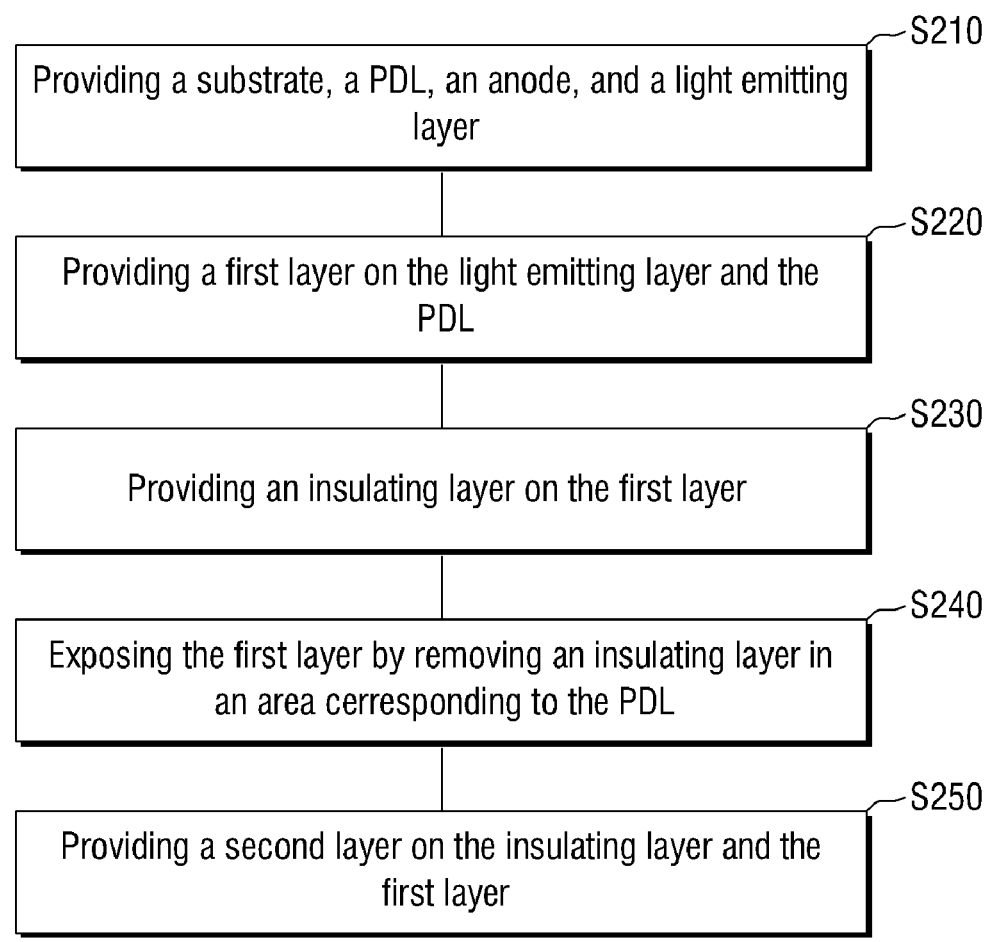
FIG. 6 is a process flowchart of another exemplary embodiment of a method for manufacturing a light emitting device according to the invention.

FIG. 6 is a flowchart of another exemplary embodiment of a method for manufacturing a light emitting device according to the invention. FIGS. 7A to 7E are schematic cross-sectional views illustrating a configuration of the light emitting device in the method for manufacturing of FIG. 6.

An exemplary embodiment of a method for manufacturing a light emitting device according to the invention includes forming (e.g., providing) a substrate 310, a PDL 320, an anode 330, and a light emitting layer 340 (S210), forming a first layer 351 on the light emitting layer 340 and the PDL 320 (S220), forming an insulating layer 352 on the first layer (S230), exposing the first layer 351 by removing the insulating layer 352 at an area corresponding to the PDL 320 (S240), and forming a second layer 353 on the insulating layer 352 and the first layer 351 (S250).

Figure 7A:
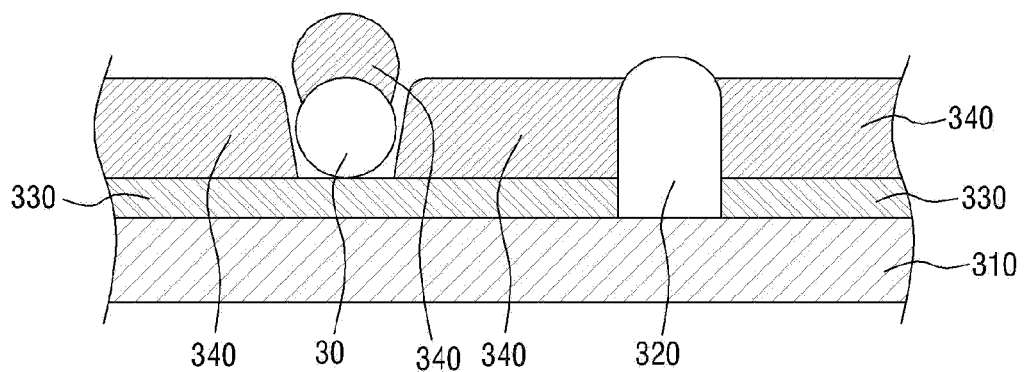
FIGS. 7A to 7E are schematic cross-sectional views of the light emitting device in the method for manufacturing of FIG. 6.
Figure 7B:
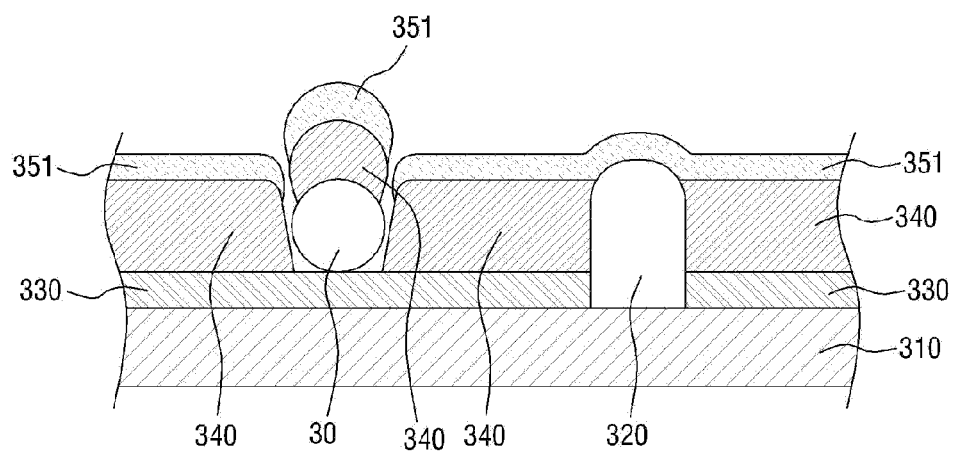

Since operations S210, S220 and S250 are the same as operations S110, S120 and S140 described above, and since FIGS. 5A and 5B are the same as FIGS. 7A and 7B, a duplicated description is omitted, and hereinafter, operations S230 and S240 will be described.

Figure 7C:
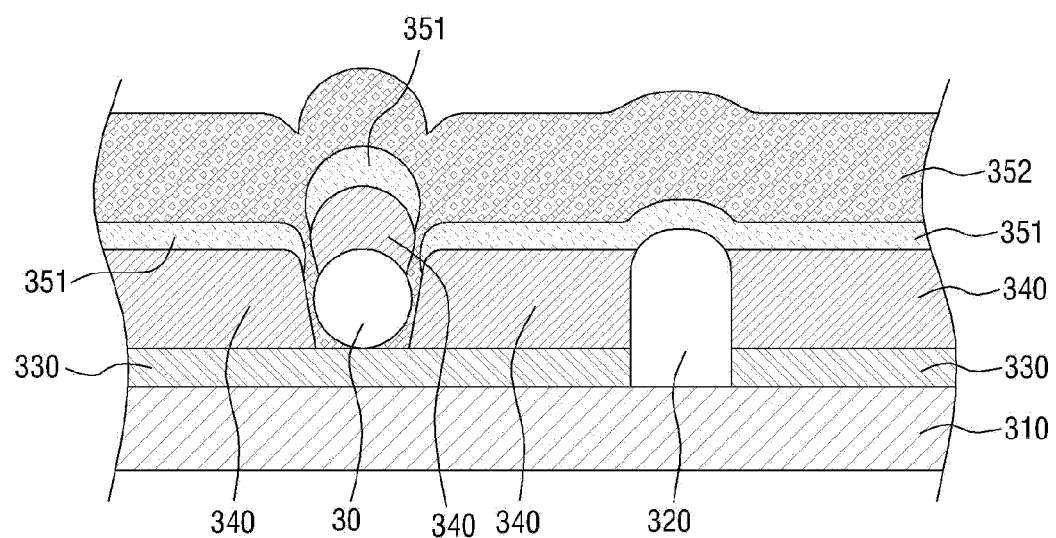

Referring to FIG. 7C, the insulating layer 352 is formed on the first layer 351. The insulating layer 352 may be formed by using a deposition method and formed by using an open mask. The insulating layer 352 is formed on an entirety of the substrate 310.

Figure 7D:
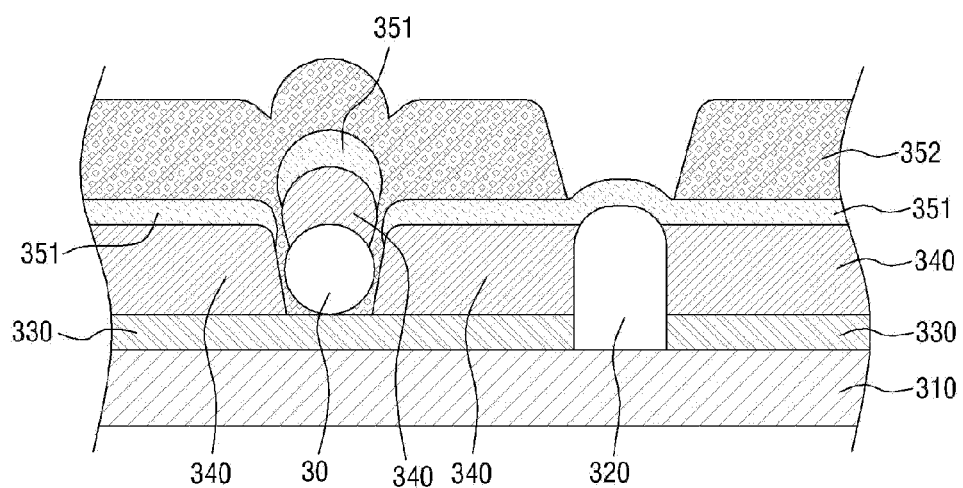

Referring to FIG. 7D, the first layer 351 may be exposed by removing a portion of the insulating layer 352 at the area corresponding to the PDL 320. A photoresist may be used to remove the insulating layer 352, but the invention is not limited only thereto. An opening may be defined in the insulating layer 352 to expose a portion of the first layer 351.

Figure 7E:
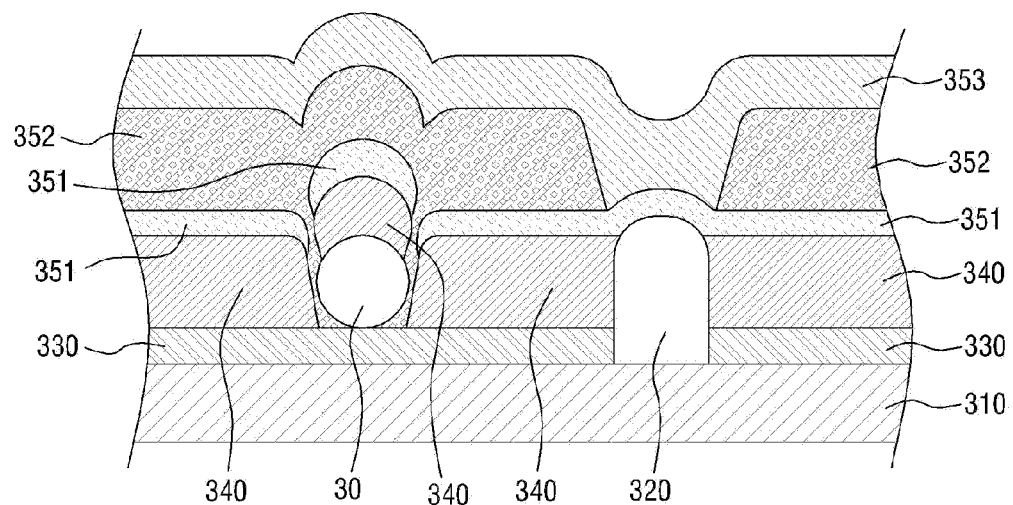

Referring to FIG. 7E, the second layer 353 is formed on the insulating layer 352 and on the exposed portion of the first layer 351.

Hereinafter, the invention will be described in more detail through examples. The examples are only used to represent the invention in detail, and it will be apparent to those skilled in the art that the scope of the invention is not limited by the examples according to the spirit of the invention.

EXAMPLE 1, REFERENCE EXAMPLES 1 TO 5, AND COMPARATIVE EXAMPLE 1

A substrate, an anode and a light emitting layer are sequentially formed (e.g., provided), and a cathode is disposed on the light emitting layer and configured as detailed in Table 1, to manufacture a light emitting device.

TABLE 1

| | Configuration of Cathode |
|---|---|
| Example 1 | Al 700 Å deposition/LiQ 500 Å deposition/Al 2300 Å deposition |
| Reference Example 1 | Al 1000 Å deposition/LiQ 500 Å deposition/Al 2000 Å deposition |
| Reference Example 2 | Al 1300 Å deposition/LiQ 500 Å deposition/Al 1700 Å deposition |
| Reference Example 3 | Al 1500 Å deposition/LiQ 500 Å deposition/Al 1500 Å deposition |

TABLE 1-continued

| | Configuration of Cathode |
|---|---|
| Reference Example 4 | Al 1800 Å deposition/LiQ 500 Å deposition/Al 1200 Å deposition |
| Reference Example 5 | Al 2000 Å deposition/LiQ 500 Å deposition/Al 1000 Å deposition |
| Comparative Example 1 | Al 3000 Å single-layer cathode deposition |

EXPERIMENTAL EXAMPLE 1

Figure 8:
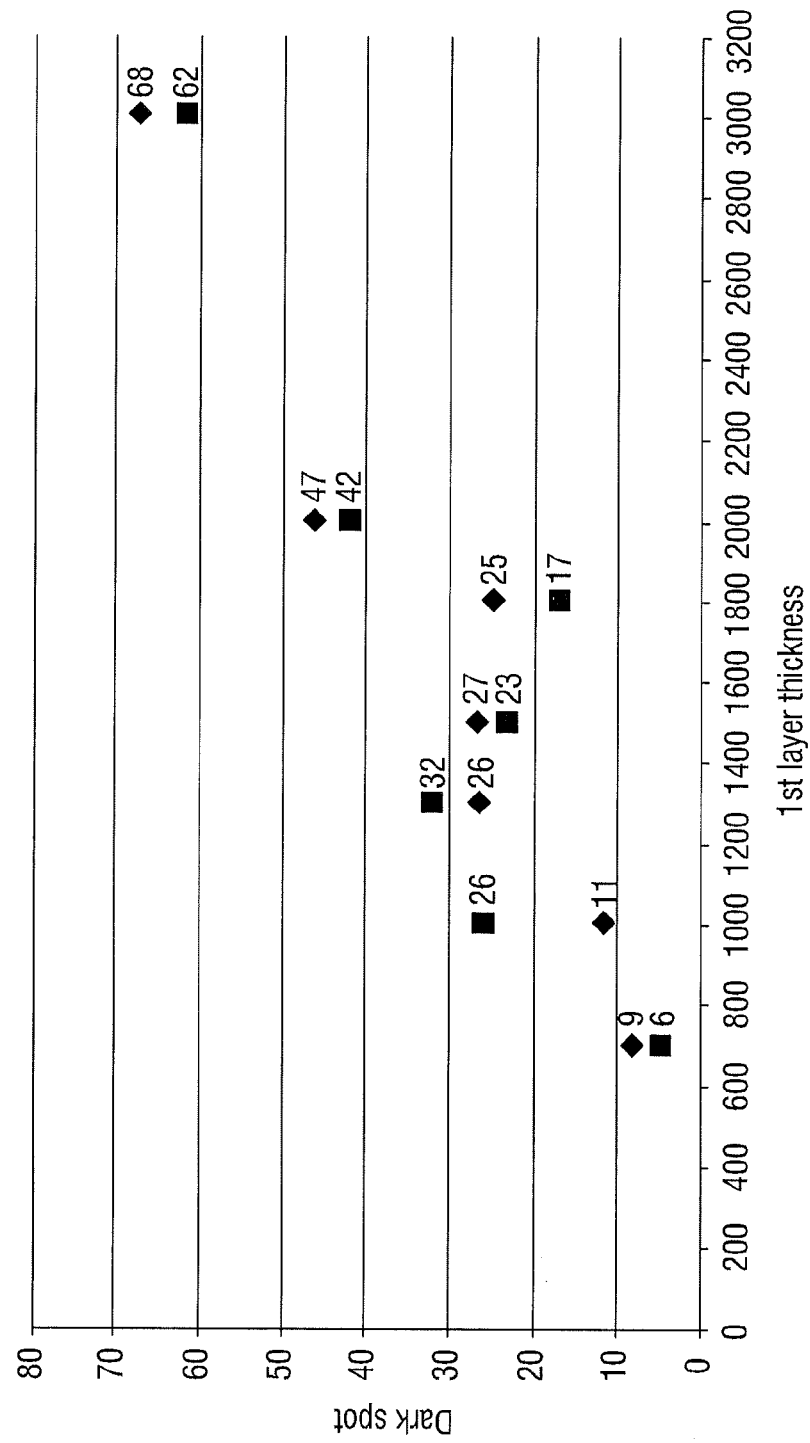
FIG. 8 is a graph illustrating a result of examining the number of dark spots of light emitting devices according to Experimental Example 1.

The number of dark spots in each pair of the light emitting devices manufactured in Example 1, Reference Examples 1 to 5, and Comparative Example 1, with respect to a cross-sectional thickness of the first layer in Å, is represented in the graph of FIG. 8.

Referring to FIG. 8, the number of dark spots in the light emitting device of Comparative Example 1 including a single-layer cathode in which aluminum (Al) is deposited with a thickness of 3000 Å was 60. It can be seen that as the thickness of a first layer of a multi-layer cathode becomes small, the number of dark spots decreases. The reason the number of dark spots decreases as the thickness of a first layer of the multi-layer cathode becomes small is that while the thickness of a first layer decreases, a step coverage is degraded in order to reduce or effectively prevent an electrical short from occurring between an anode and the cathode in a pixel, when a foreign material exists in the pixel. In particular, the number of dark spots in the light emitting device of Example 1 in which aluminum is deposited with a thickness of 700 Å as the first layer of the multi-layer cathode, was a single digit.

EXPERIMENTAL EXAMPLE 2

Electrical resistance of the cathode of Example 1 was compared with electrical resistance of the cathode of Comparative Example 1. As a result, it was confirmed that the electrical resistances of the multi-layer cathode of Example 1 and the single-layer cathode of Comparative Example 1, have substantially the same value as each other.

It is understood that the electrical resistances of the multi-layer cathode of Example 1 and the single-layer cathode of Comparative Example 1 since the total thickness of aluminum, which is a conductive material of the cathode, is uniform, so that total resistance does not increase even though the first layer is additionally included in the cathode.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other embodiments, are intended to be included within the scope of the appended claims. The invention is defined by the following claims, with equivalents of the claims to be included therein.

What is claimed is:

1. A light emitting device, comprising:
a pixel defining layer comprising a plurality of pixel defining layer elements, on a substrate;
a first electrode in a space defined by the substrate and the pixel defining layer;
a light emitting layer in a space defined by the first electrode and the pixel defining layer; and
a second electrode on the light emitting layer and the pixel defining layer, and comprising:
a plurality of layers, and
an insulating layer between the plurality of layers and overlapping the light emitting layer in an area adjacent to the pixel defining layer elements, and exposing a layer among the plurality of layers in an area corresponding to the pixel defining layer elements.

2. The light emitting device of claim 1, wherein the second electrode further comprises a reflective material.

3. The light emitting device of claim 2, wherein the reflective material is one selected from aluminum, silver and copper, and a combination thereof.

4. The light emitting device of claim 1, wherein the plurality of layers of the second electrode comprises:
a first layer, and
a second layer having a cross-sectional thickness larger than that of the first layer.

5. The light emitting device of claim 4, wherein the first layer is adjacent to the light emitting layer.

6. The light emitting device of claim 4, wherein the first layer has a thickness in the range of about 700 angstroms to about 900 angstroms.

7. The light emitting device of claim 4, wherein the second layer has a thickness in the range of about 2100 angstroms to about 2300 angstroms.

8. The light emitting device of claim 4, wherein the first layer and the second layer contact each other in the area corresponding to the pixel defining layer.

9. The light emitting device of claim 4, wherein the first layer and the second layer comprise a same material or different materials.

10. An organic electroluminescence device, comprising:
a pixel defining layer comprising a plurality of pixel defining layer elements on a transparent substrate, and having an electrical insulating property;
an anode on the transparent substrate and in a space defined by the transparent substrate and the pixel defining layer;
an organic light emitting layer in a space defined by the anode and the pixel defining layer; and
a cathode on the organic light emitting layer, and comprising:
a first metallic layer adjacent to the organic light emitting layer, and
a second metallic layer having a cross-sectional thickness larger than that of the first metallic layer, and spaced apart from the organic light emitting layer, wherein the first metallic layer is between the second metallic layer and the organic light emitting layer,
wherein the anode is disposed between the transparent substrate and the cathode.

11. The organic electroluminescence device of claim 10, wherein the anode comprises a transparent material.

12. The organic electroluminescence device of claim 10, wherein the cathode further comprises an organic insulating layer between the first metallic layer and the second metallic layer, and in an area corresponding to the organic light emitting layer.

13. The organic electroluminescence device of claim 12, wherein the first metallic layer and the second metallic layer of the cathode contact each other in an area corresponding to the pixel defining layer.

14. The organic electroluminescence device of claim 10, wherein the first metallic layer and the second metallic layer comprises a same metal or different metals.

* * * * *